(12) United States Patent
Lee et al.

(10) Patent No.: US 12,733,219 B2
(45) Date of Patent: Sep. 8, 2026

(54) SEMICONDUCTOR DEVICE INCLUDING BACKSIDE ISOLATION STRUCTURE AND PLACEHOLDER ISOLATION STRUCTURE

(71) Applicant: SAMSUNG ELECTRONICS CO., LTD., Suwon-si (KR)

(72) Inventors: Jaehong Lee, Latham, NY (US); Seung Min Song, Clifton Park, NY (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 446 days.

(21) Appl. No.: 18/214,221

(22) Filed: Jun. 26, 2023

(65) Prior Publication Data

US 2024/0290834 A1 Aug. 29, 2024

Related U.S. Application Data

(60) Provisional application No. 63/448,485, filed on Feb. 27, 2023.

(51) Int. Cl.
*H10D 62/10* (2025.01)
*H10D 8/00* (2025.01)
(Continued)

(52) U.S. Cl.
CPC .......... *H10D 62/116* (2025.01); *H10D 8/411* (2025.01); *H10D 30/43* (2025.01);
(Continued)

(58) Field of Classification Search
CPC ...... H10D 62/116; H10D 8/411; H10D 30/43; H10D 30/6735; H10D 30/6757;
(Continued)

(56) References Cited

U.S. PATENT DOCUMENTS 11,239,325 B2 2/2022 Huang et al.
11,437,283 B2 9/2022 Lilak et al.
(Continued)

FOREIGN PATENT DOCUMENTS

EP 4 345 905 A1 4/2024
TW 202139470 A 10/2021
(Continued)

OTHER PUBLICATIONS

Communication issued Aug. 1, 2024 by the European Patent office in the European Patent Application No. 24154999.7.

*Primary Examiner* — Britt Hanley
*Assistant Examiner* — William C. Trice, III
(74) *Attorney, Agent, or Firm* — Myers Bigel, P.A.

(57) ABSTRACT

Provided is a semiconductor device including: a 1$^{st}$ source/drain region and a 1$^{st}$ backside contact structure, vertically below the 1$^{st}$ source/drain region, connected to the 1$^{st}$ source/drain region; a 2$^{nd}$ source/drain region and a 1$^{st}$ placeholder isolation structure vertically below the 2$^{nd}$ source/drain region; and a backside isolation structure, on a back side of the semiconductor device, surrounding the 1st backside contact structure and the 1st placeholder isolation structure.

20 Claims, 6 Drawing Sheets

(51) Int. Cl.
*H10D 30/43* (2025.01)
*H10D 30/67* (2025.01)
*H10D 62/13* (2025.01)
*H10D 84/80* (2025.01)

(52) U.S. Cl.
CPC ..... *H10D 30/6735* (2025.01); *H10D 30/6757* (2025.01); *H10D 62/121* (2025.01); *H10D 62/151* (2025.01); *H10D 84/811* (2025.01)

(58) Field of Classification Search
CPC .. H10D 62/121; H10D 62/151; H10D 84/811; H10D 64/251; H10D 84/83; H10D 84/0149; H10D 84/0151; H10D 84/0188; H10D 84/85; H10D 88/01; H10D 84/038; H10D 30/6219; H10D 62/115
See application file for complete search history.

(56) References Cited

U.S. PATENT DOCUMENTS

| | | | | |
|---|---|---|---|---|
| 11,450,663 | B2 | 9/2022 | Chen et al. | |
| 11,588,050 | B2 | 2/2023 | Yu et al. | |
| 11,658,119 | B2 | 5/2023 | Huang et al. | |
| 11,848,372 | B2 | 12/2023 | Su et al. | |
| 11,901,456 | B2 | 2/2024 | Ju et al. | |
| 2021/0366907 | A1 | 11/2021 | Liao et al. | |
| 2022/0052206 | A1 | 2/2022 | Cheng et al. | |
| 2022/0130759 | A1 | 4/2022 | Huang et al. | |
| 2022/0199530 | A1 | 6/2022 | Huang et al. | |
| 2022/0344496 | A1 | 10/2022 | Su et al. | |
| 2022/0359265 | A1 | 11/2022 | Chang et al. | |
| 2023/0037957 | A1 | 2/2023 | Thomas et al. | |
| 2023/0062940 | A1 | 3/2023 | Khaderbad et al. | |
| 2023/0268389 | A1* | 8/2023 | Jain | H10D 30/6735 257/288 |
| 2024/0105609 | A1* | 3/2024 | Wu | H10W 20/427 |
| 2024/0105613 | A1* | 3/2024 | Xie | H01L 21/76897 |
| 2024/0162229 | A1* | 5/2024 | Xie | H10D 30/43 |

FOREIGN PATENT DOCUMENTS

| | | | |
|---|---|---|---|
| TW | 202209450 | A | 3/2022 |
| TW | 202218046 | A | 5/2022 |
| TW | 202308055 | A | 2/2023 |

* cited by examiner 10
191
161
270
122
162
192
180-1
194
164
195
165
170
180-2
181
182
183
185
186
187
131
132
133
135
136
137
111
141
112
142
105
130-1
114
144
115
145
130-2
P+
N-
P11

4000
4100
APPLICATION PROCESSOR(S)
4200
COMMUNICATION MODULE
4300
DISPLAY/TOUCH MODULE
4400
STORAGE DEVICE
4500
BUFFER RAM

SEMICONDUCTOR DEVICE INCLUDING BACKSIDE ISOLATION STRUCTURE AND PLACEHOLDER ISOLATION STRUCTURE

CROSS-REFERENCE TO RELATED APPLICATION

This application is based on and claims priority from U.S. Provisional Application No. 63/448,485 filed on Feb. 27, 2023 in the U.S. Patent and Trademark Office, the disclosure of which is incorporated herein in its entirety by reference.

BACKGROUND

1. Field

Apparatuses and methods consistent with example embodiments of the disclosure relate to a semiconductor device with a backside isolation structure and a placeholder isolation structure.

2. Description of Related Art

In a semiconductor device including a plurality of active devices (e.g., transistors) and passive devices (e.g., PN junction diodes) formed on a substrate, a shallow trench isolation (STI) structure separates or isolates two adjacent devices to suppress current leakage therebetween. The STI structure including an oxide material is buried in a deep and narrow trench formed in a substrate. Formation of the STI structure in the substrate requires a long oxidation time at high temperature, which increases manufacturing costs of the semiconductor device. Herein, the isolation may refer to electrical insulation.

Further, when the STI structure is formed in a semiconductor device including three-dimensionally-stacked field-effect transistors (3DSFETs), an STI process becomes more complicated. The 3DSFET includes a lower field-effect transistor and an upper field-effect transistor stacked above the lower field-effect transistor, where each of the field-effect transistors may be a fin field-effect transistor (FinFET), a nanosheet transistor, or the like. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, multi-bridge channel field-effect transistor (MBCFET).

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device including a plurality of 3DSFETs and a plurality of passive devices with a backside isolation structure and a placeholder isolation structure.

According to embodiments, there is provided a semiconductor device which may include: a $1^{st}$ source/drain region and a $1^{st}$ backside contact structure, vertically below the $1^{st}$ source/drain region, connected to the $1^{st}$ source/drain region; a $2^{nd}$ source/drain region and a $1^{st}$ placeholder isolation structure vertically below the $2^{nd}$ source/drain region; and a backside isolation structure, on a back side of the semiconductor device, surrounding the $1^{st}$ backside contact structure and the $1^{st}$ placeholder isolation structure.

According to an embodiment, the $1^{st}$ placeholder isolation structure and the backside isolation structure may include different materials.

According to an embodiment, the $1^{st}$ placeholder isolation structure may include silicon nitride, and the backside isolation structure may include silicon oxide.

According to an embodiment, there is provide a semiconductor device which may include: a $1^{st}$ device comprising at least one $1^{st}$ transistor forming a logic device or a memory device; a $2^{nd}$ device comprising at least one $2^{nd}$ transistor forming another logic device or another memory device; and a backside isolation structure at a back side of each of the $1^{st}$ and $2^{nd}$ devices, wherein the $1^{st}$ device is horizontally adjacent to the $2^{nd}$ device, and wherein no shallow trench isolation (STI) structure is formed between the $1^{st}$ device from the $2^{nd}$ device in the backside isolation structure.

According to an embodiment, there is provided a semiconductor device which may include: a $1^{st}$ device comprising at least one transistor; a $2^{nd}$ device comprising at least one passive device; and a backside isolation structure at a back side of the $1^{st}$ and $2^{nd}$ devices, wherein the $1^{st}$ device is horizontally adjacent to the $2^{nd}$ device, and wherein no STI structure is formed between the $1^{st}$ device from the $2^{nd}$ device in the backside isolation structure.

BRIEF DESCRIPTION OF DRAWINGS

Example embodiments of the disclosure will be more clearly understood from the following detailed description taken in conjunction with the accompanying drawings in which.

DETAILED DESCRIPTION OF EMBODIMENTS

Figure 1A:
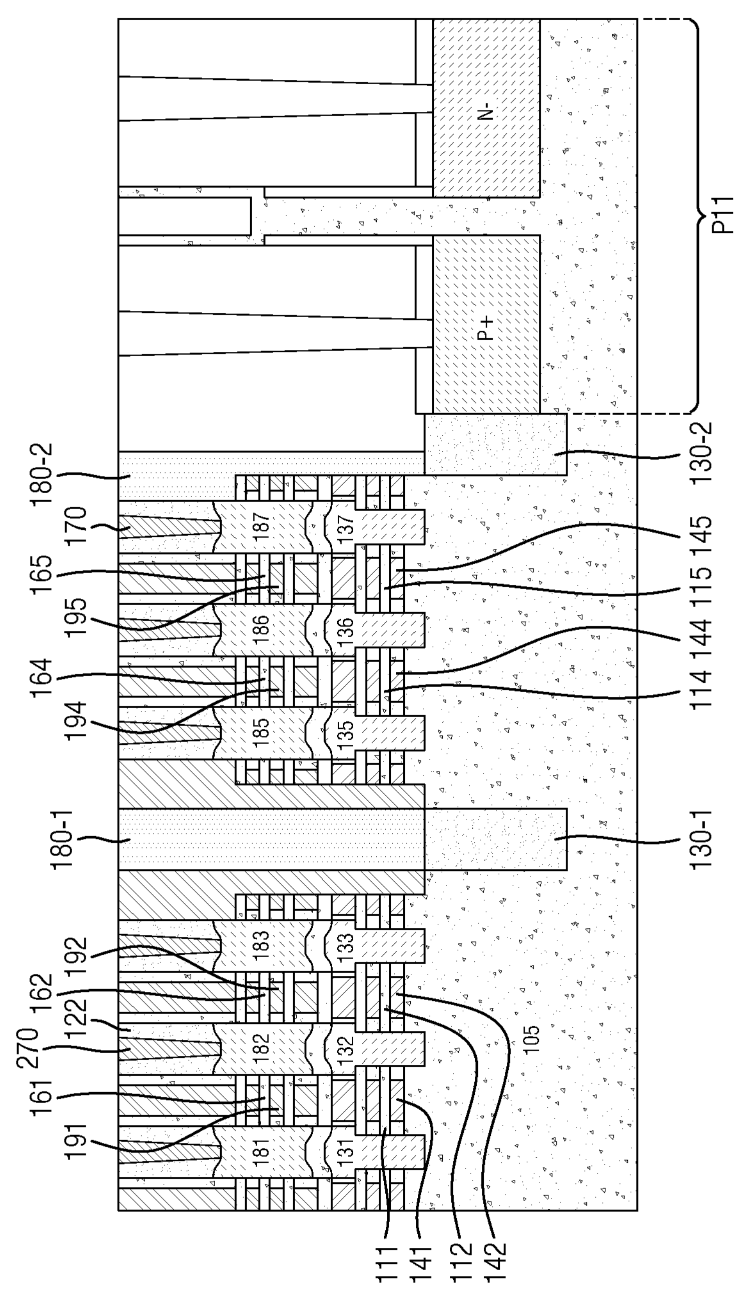
FIGS. 1A-1C illustrate a semiconductor device including a plurality of three-dimensionally-stacked field-effect transistors (3DSFETs) and a plurality of passive devices with STI structures as device isolation structure, according to an embodiment.

The embodiments of the disclosure described herein are example embodiments, and thus, the disclosure is not limited thereto, and may be realized in various other forms. Each of the embodiments provided herein is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it is to be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It is to be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the drawings. It is to be understood that the spatially relative terms are intended to encompass different orientations of a semiconductor device in use or operation in addition to the orientation depicted in the drawings. For example, if the semiconductor device in the drawings is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "lower" element and an "upper" element" may be an "upper" element and a "lower" element when a device or structure including these elements are differently oriented. Thus, in the descriptions herebelow, the "lower" element and the "upper" element may also be referred to as a "$1^{st}$" element or a "$2^{nd}$" element, respectively, as long as their structural relationship is clearly understood in the context of the descriptions. Similarly, the terms a "left" element and a "right" element may be respectively referred to as a "$1^{st}$" element and a "$2^{nd}$" element with necessary descriptions to distinguish the two elements.

It is to be understood that, although the terms "$1^{st}$," "$2^{nd}$," "$3^{rd}$" "$4^{th}$" "$5^{th}$" "$6^{th}$," etc. may be used herein to describe various elements, these elements should not be limited by these terms. These terms are only used to distinguish one element from another element. Thus, a $1^{st}$ element described in one embodiment herein could be termed a $2^{nd}$ element in another embodiment or claims of the disclosure without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It is to be understood that various elements shown in the drawings are schematic illustrations not drawn to scale. In addition, for ease of explanation, one or more elements of a type commonly used to form semiconductor devices may not be explicitly shown in the drawings without implying these elements are omitted from actual semiconductor devices. Furthermore, it is to be understood that the embodiments described herein are not limited to particular materials, features, and manufacturing steps or operations shown or described herein. Thus, with respect to semiconductor manufacturing steps, the descriptions provided herein are not intended to include all steps that may be required to form an actual semiconductor device. For example, the commonly-used steps such as planarizing, cleaning, or annealing steps may not be described herein for the sake of brevity. It is to be also understood that, even if a certain step or operation is described later than another step or operation, the step or operation may be performed later than the other step or operation unless the other step or operation is described as being performed after the step or operation.

Many embodiments are described herein with reference to cross-sectional views that are schematic illustrations of the embodiments. As such, variations from the shapes of the illustrations as a result, for example, of manufacturing techniques and/or tolerances, are to be expected. Thus, the embodiments should not be construed as limited to the particular shapes of elements illustrated herein but are to include deviations in shapes that result, for example, from manufacturing. Various elements illustrated in the drawings are schematic in nature and their shapes are not intended to illustrate the actual shape of an element of a semiconductor device and are not intended to limit the scope of the disclosure.

Moreover, conventional elements of a semiconductor device and their functions, materials and shapes may not be described when these elements are not related to the novel features of the embodiments or not necessary in describing the same. Further, the conventional elements may be illustrated in the drawings without reference numbers without descriptions thereof. Such elements may include a gate spacer isolating a gate structure from adjacent elements, an inner spacer isolating a gate structure from a source/drain region, an isolation layer isolating a lower source/drain region from an upper source/drain region, an isolation layer isolating a lower gate structure from an upper gate structure, etc., not being limited thereto.

Herebelow, various embodiments of the disclosure will be described in reference to FIGS. 1A-1C to FIGS. 2A and 2B.

Figure 1B:
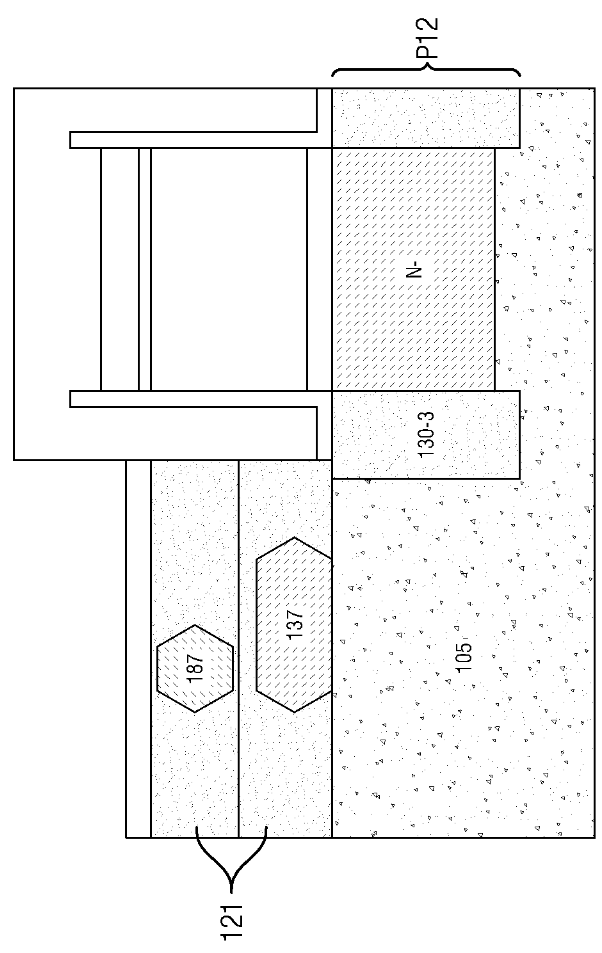
Figure 1C:
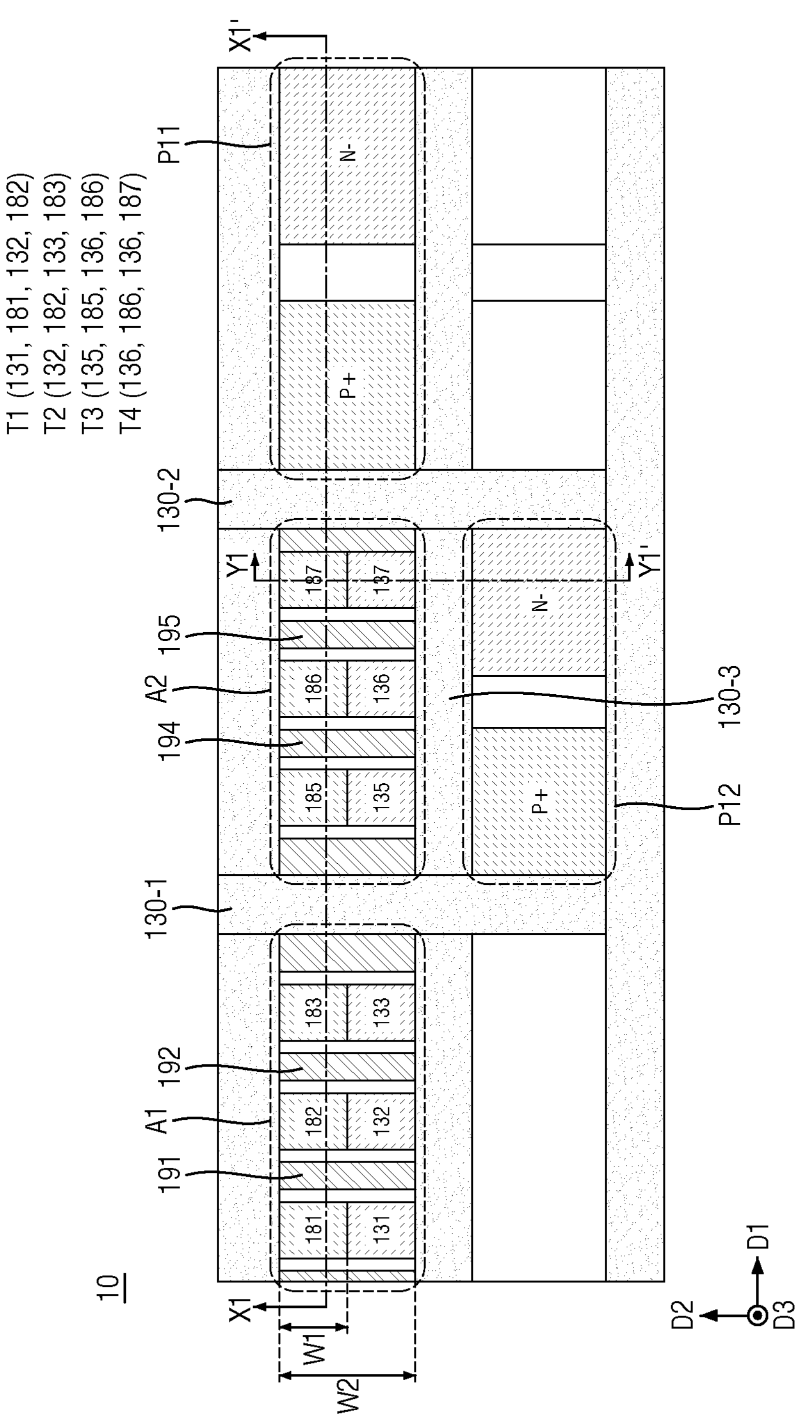

FIGS. 1A-1C illustrate a semiconductor device including a plurality of three-dimensionally-stacked field-effect transistors (3DSFETs) and a plurality of passive devices with STI structures as device isolation structure, according to an embodiment.

FIG. 1C is a top plan view of the semiconductor device, and FIGS. 1A and 1B are cross-section views of the semiconductor device of FIG. 1C taken along lines X1-X1' and Y1-Y1', respectively. It is to be understood that FIG. 1C is provided to help understanding of a positional relationship of active regions such as source/drain regions and a gate structure with respect to STI structures, and thus, some elements of the semiconductor device such as channel structures, contact structures, isolation structures and diffusion break structures shown in FIGS. 1A and 1B are not shown in FIG. 1C.

Referring to FIG. 1A-1C, a semiconductor device 10 may include a $1^{st}$ active device zone A1, a $2^{nd}$ active device zone A2 and a passive device zone P on a substrate 105 which may be formed of, for example, silicon (Si).

In the 1st active device zone A1, a plurality of lower source/drain regions 131, 132 and 133 may be arranged in the D1 direction, and a plurality of upper source/drain regions 181, 182 and 183$_{[KM1]}$ respectively stacked above the lower source/drain regions 131, 132, 133 may also be arranged in the D1 direction.

The two lower source/drain regions 131 and 132 may be connected to each other through a lower channel structure 111 including two nanosheet layers surrounded by a lower gate structure 141, and the two upper source/drain regions 181 and 182 above the lower source/drain regions 131 and 132 may be connected to each other through an upper channel structure 161 including three nanosheet layers surrounded by an upper gate structure 191. The source/drain regions 131, 132, 181 and 182, the channel structures 111 and 161, and the gate structures 141 and 191 may form a 1st 3DSFET T1 in the 1st active device zone A1.

Similarly, the two lower source/drain regions 132 and 133 may be connected to each other through a lower channel structure 112 including two nanosheet layers surrounded by a lower gate structure 142, and the two upper source/drain regions 182 and 183 above the lower source/drain regions 132 and 133 may be connected to each other through an upper channel structure 162 including three nanosheet layers surrounded by an upper gate structure 192. The source/drain regions 132, 133, 182 and 183, the channel structures 112 and 162, and the gate structures 142 and 192 may also form a 2nd 3DSFET T2 in the 1st active device zone A1.

In the 2nd active device zone A2, a plurality of lower source/drain regions 135, 136 and 137 may be arranged in the D1 direction, and a plurality of upper source/drain regions 185, 186 and 187 respectively stacked above the lower source/drain regions 135, 136 and 137 may also be arranged in the D1 direction.

The two lower source/drain regions 135 and 136 may be connected to each other through a lower channel structure 114 including two nanosheet layers surrounded by a lower gate structure 144, and the two upper source/drain regions 185 and 186 above the lower source/drain regions 135 and 136 may be connected to each other through an upper channel structure 164 including three nanosheet layers surrounded by an upper gate structure 194. The source/drain regions 135, 136, 185 and 186, the channel structures 114 and 164, and the gate structures 144 and 194 may form a 3rd 3DSFET T3 in the 2nd active device zone A2.

Similarly, the two lower source/drain regions 136 and 137 may be connected to each other through a lower channel structure 115 including two nanosheet layers surrounded by a lower gate structure 145, and the two upper source/drain regions 186 and 187 above the lower source/drain regions 136 and 137 may be connected to each other through an upper channel structure 165 including three nanosheet layers surrounded by an upper gate structure 195. The source/drain regions 136, 137, 186 and 187, the channel structures 115 and 165, and the gate structures 145 and 195 may also form a 4th 3DSFET T4 in the 2nd active device zone A2.

Each of the upper source/drain regions 181-183 and 185-187 may have a width W1 which is shorter than a width W2 of each of the lower source/drain regions 131-133 and 135-137 in a D2 direction intersecting the D1 direction, while each of the upper channel structures 161, 162, 164 and 165 has more nanosheet layers than each of the lower channel structures 111, 112, 114 and 115. Thus, in each of the 3DSFETs T1-T4 may be formed a non-overlapping region, which is a space above a portion of lower source/drain region where an upper source/drain region does not overlap so that a lower contact structure can be formed therethrough to contact a top surface of the lower source/drain region.

In each of the 1st active device zone A1 and the 2nd active device zone A2, an inner spacer and a gate spacer may be formed at side surfaces of each of the gate structures 141, 142, 144, 145, 191, 192, 194 and 195 to isolate the corresponding gate structure from an adjacent structure element.

In each of the 1st active device zone A1 and the 2nd active device zone A2, an upper contact structure 170 may be formed to contact a top surface of each of the upper source/drain regions 181-183 and 185-187 to provide each of the upper source/drain regions 181-183 and 185-187 with a frontside connection path to a voltage source or another circuit element. The upper contact structure 170 may be formed in a middle-of-line (MOL) isolation structure 122. A lower contact structure may also be formed on each of the lower source/drain regions 131-133 and 135-137 through a non-overlapping region to provide each of the lower source/drain regions 131-133 and 135-137 with a frontside connection path to a voltage source or another circuit element.

The upper contact structure 170 and the lower contact structure may each be formed of a material such as copper (Cu), aluminum (Al), tungsten (W), molybdenum (Mo), ruthenium (Ru), cobalt (Co), etc., not being limited thereto. The MOL isolation structure 260 may be formed of a material such as silicon oxide (e.g., SiO, $SiO_2$, etc.)

In the passive device zone P, a plurality of PN junction diodes including a 1st PN junction diode P11 and a 2nd PN junction diode P12 may be formed on the substrate 105. The 1st PN junction diode P11 may include a p-type region P+ and an n-type region N-respectively formed by doping respective regions in the substrate 105 with p-type impurities and n-type impurities. The p-type impurities may include boron (B), gallium (Ga), indium (In), etc., and the n-type impurities may include phosphorus (P), arsenic (As), antimony (Sb), etc. Similarly, the 2nd PN junction diode P12 may include a p-type region P+ and an n-type region N-.

Although FIGS. 1A-1C show that only a few number of 3DSFETs and PN junction diodes are formed in the semiconductor device 10, more 3DSFETs and PN junction diodes may be formed in the D1 and D2 directions.

According to an embodiment, the 1st active device zone A1 and the 2nd active device zone A2 may be isolated from each other by an STI structure 130-1 as well as a diffusion break structure 180-1 thereon. For example, the 2nd 3DSFET T2 and the 3rd 3DSFET T3 may be isolated by the STI structure 130-1 and the diffusion break structure 180-1 thereon as shown in FIGS. 1A and 1C.

According to an embodiment, the 2nd active device zone A2 may be isolated from the passive device zone P by an STI structure 130-2, a diffusion break structure 180-2 thereon, an STI structure 130-3 and a front isolation structure 121. The 4th 3DSFET T4 may be isolated from the 1st PN junction diode P11 by the STI structure 130-2 and the diffusion break structure 180-2, as shown in FIGS. 1A and 1C. The 4th 3DSFET T4 may be isolated from the 2nd PN junction diode P12 by the STI structure 130-3 and the front isolation structure 121 surrounding the source/drain regions 137 and 187, as shown in FIGS. 1B and 1C.

The STI structure 130-1 may be formed of a material such as silicon oxide (e.g., SiO, $SiO_2$, etc.). The diffusion break structure 180-1 may be formed a material such as silicon oxide (e.g., SiO, $SiO_2$, etc.) or silicon nitride (e.g., SiN, $Si_3N_4$, etc.).

However, formation of the STI structures in a semiconductor device including 3DSFETs and passive devices may require more resources and more complicated at least because of structural complexity of the 3DSFETs. Thus, the disclosure provides an embodiment in which a backside contact structure is formed at a back side of a semiconductor device to connect a lower source/drain region, instead of forming a frontside lower contact structure, and device isolation at the back side of the semiconductor device is performed by a backside isolation structure replacing a substrate to form the backside contact structure and a placeholder isolation structure used to form the backside isolation structure, instead of forming an STI structure in the substrate.

Figure 2A:
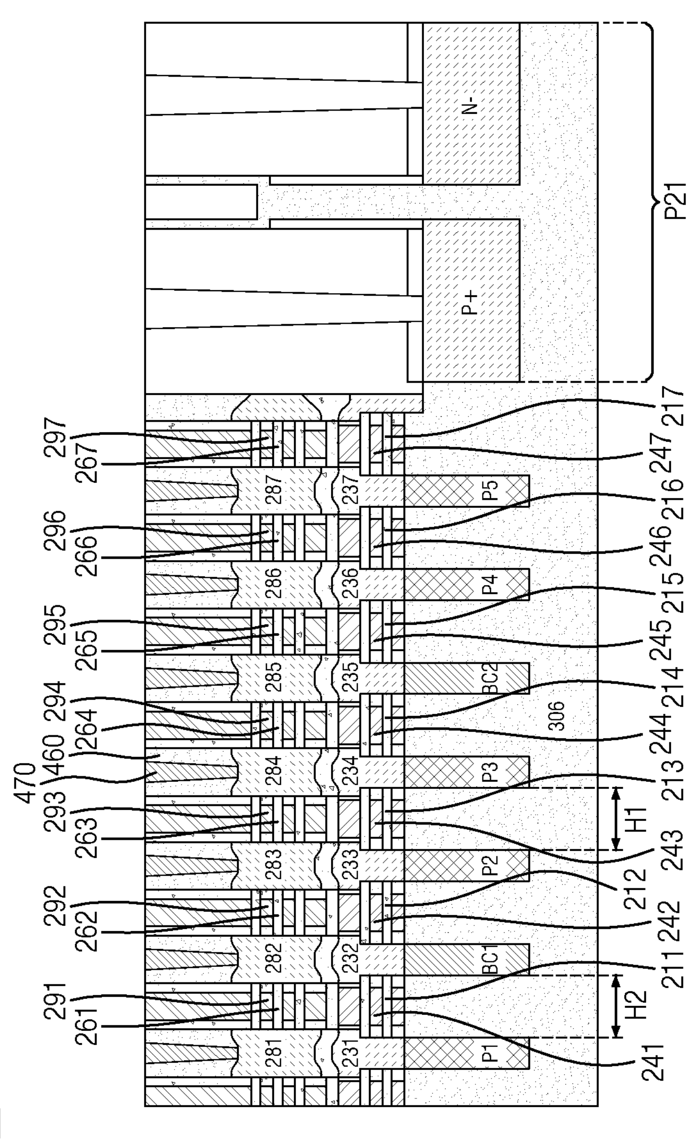
FIGS. 2A and 2B illustrate a semiconductor device including a plurality of 3DSFETs and a plurality of passive devices with a backside isolation structure and a placeholder isolation structure, according to an embodiment.
Figure 2B:
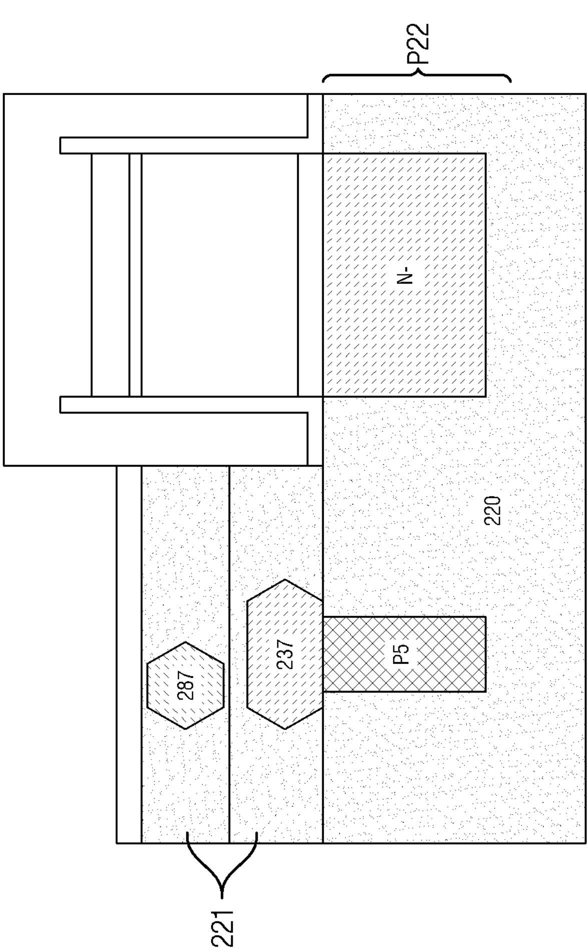

FIGS. 2A and 2B illustrate a semiconductor device including a plurality of 3DSFETs and a plurality of passive devices with a backside isolation structure and a placeholder isolation structure, according to an embodiment.

It is understood that FIGS. 2A and 2B cross-section view of the semiconductor device according to the present embodiment, corresponding to FIGS. 1A and 1B of the previous embodiment described above.

Referring to FIGS. 2A and 2B, a semiconductor device 20 may include a plurality of 3DSFETs and passive devices such as PN junction diodes similar to those included in the semiconductor device 10 of FIGS. 1A and 1B. Thus, duplicate descriptions of the 3DSFETs and the passive devices may be omitted herebelow, and instead, different aspects of the semiconductor device 20 may be provided.

Similar to the semiconductor device 10, the semiconductor device 20 may also include a plurality of lower source/drain regions 231-237 and a plurality of upper source/drain regions 281-287 respectively stacked above the lower source/drain regions 231-237. The semiconductor device 20 may also include a plurality of lower channel structures 211-216 respectively connecting adjacent two lower source/drain regions among the lower source/drain regions 231-237, and a plurality of upper channel structures 261-266 respectively connecting adjacent two upper source/drain regions among the upper source/drain regions 281-287. The lower channel structures 211-216 may each include two nanosheet layers surrounded by lower gate structures 241-246, respectively. Similarly, the upper channel structures 261-266 may each include three nanosheet layers surrounded by upper gate structures 291-296, respectively.

Further, an upper contact structure 270 may be formed in an MOL isolation structure 222 to contact a top surface of the upper source/drain regions 281-287 to provide each of the upper source/drain regions 282-287 with a frontside connection path to a voltage source or another circuit element.

However, the semiconductor device 20 may not include a substrate and an STI structure such as the substrate 105 and the STI structures 130-1, 130-2 and 130-3 included in the semiconductor device 10 as shown in FIGS. 1A-1C. Instead, according to embodiments, the semiconductor device 20 may have a backside isolation structure 220 at a back side thereof and a plurality of backside contact structures BC1, BC2 and placeholder isolation structures P1-P5 formed in the backside isolation structure 220.

The backside contact structures BC1 and BC2 may be formed in the backside isolation structure 220 vertically below the lower source/drain regions 232 and 235 to contact bottom surfaces thereof, respectively, according to an embodiment. The backside contact structures BC1 and BC2 may respectively connect the lower source/drain regions 232 and 235 to a voltage source or another circuit element through at least one backside metal line BM formed below the backside contact structures BC1 and BC2. The backside contact structures BC1 and BC2 along with the backside isolation structure 220 and the backside metal line forms a backside power distribution network (PSPDN) which may reduce a size of the semiconductor device 20 and reduce device complexity at a front side of the semiconductor device 20.

The placeholder isolation structures P1-P5 may be formed vertically below the lower source/drain regions 231, 233, 234, 236 and 237, respectively, according to an embodiment. The placeholder isolation structures P1-P5 are provided at positions where backside contact structures for the lower source/drain regions 231, 233, 234, 236 and 237 are to be formed in the backside isolation structure 220 during a process of manufacturing the semiconductor device 20. This is because the placeholder isolation structures P1-P5 are formed by filling an isolation material in respective placeholder recesses which are originally provided to be filled in with a metal or a metal compound to form backside contact structures therein. Thus, for example, the placeholder isolation structure P1 may be replaced by another backside contact structure if the lower source/drain region 231 is designed to be connected to a voltage source or another circuit element through a backside metal line.

Thus, a horizontal distance between adjacent two placeholder isolation structures may be equal to each of a horizontal distance between adjacent two backside contact structures and a horizontal distance between a placeholder isolation structure and an adjacent backside contact structure. For example, a horizontal distance H1 between the two adjacent placeholder isolation structures P2 and P3 may be equal to a horizontal distance H2 between the placeholder isolation structure P1 and the adjacent backside contact structure BC1. It is understood here that, if the placeholder isolation structure P1 is replaced by another backside contact structure, the horizontal distance H2 is to be a horizontal distance between two adjacent backside contact structures, which may be equal to the horizontal distance H1 between the two adjacent placeholder isolation structures P2 and P3.

According to an embodiment, the backside isolation structure 220 may be formed of a dielectric material such as silicon oxide (e.g., SiO, $SiO_2$, etc.), and the placeholder isolation structures P1-P5 may be formed of a dielectric material such as silicon nitride (e.g., SiN, $Si_3N_4$, etc.) having a dielectric constant different from that of the dielectric material of the backside isolation structure 220, not being limited thereto. According to an embodiment, the placeholder isolation structures P1-P5 may be formed of the same material or material composition as the backside isolation structure 220, in which case an interface may exist between each of the placeholder isolation structures P1-P5 and the backside isolation structure 220 because these two structures are formed at temporally different steps.

The backside isolation structure 220 and the placeholder isolation structures P1-P5 may be formed at the backside of the semiconductor device 20 for the same device isolation purposes as the STI structures 130-1, 130-2 and 130-3 included in the semiconductor device 10. For example, the lower source/drain region 232 may be isolated from the adjacent lower source/drain region 233 by the backside isolation structure 220. As another example, the lower gate structure 242 may be isolated from the adjacent lower gate structure 243 by the placeholder isolation structure P2 as well as the backside isolation structure 220 surrounding the placeholder isolation structure P2.

The semiconductor device 20 may also include a plurality of PN junction diodes including a $1^{st}$ PN junction diode P21 and a $2^{nd}$ PN junction diode P22, which may correspond to the $1^{st}$ PN junction diode P11 and the $2^{nd}$ PN junction diode P12 of semiconductor device 10 shown in FIGS. 1A-1C. Each of the PN junction diodes P21 and P22 may also include a p-type region P+ and an n-type region N-. However, unlike the PN junction diodes P11 and P12 of the semiconductor device 10, the PN junction diodes P21 and P22 may not include a substrate at respective back sides thereof. According to an embodiment, the backside isolation structure 220 formed at the back side of the 3DSFETs may be extended to the back side of the PN junction diodes P21 and P22 to isolate each of the PN junction diodes P21 and P22 from an adjacent 3DSFET including the lower source/drain region 237 and a lower gate structure 247. Thus, the semiconductor device 20 including both active devices and passive devices may also dispense with an STI structure such as the STI structures 130-2 and 130-3 of the semiconductor device 10 to isolate the active devices from the passive devices.

As described above, the semiconductor device 20 according to the present embodiment does not include an STI structure for device isolation, and instead, may include the backside isolation structure 220 and the placeholder isolation structures P1-P5 at the back side of the semiconductor device 20. Thus, a process time and costs for manufacturing a semiconductor device may be reduced at least because a long oxidation time at high temperature required for the formation of the STI structure can be skipped.

Unlike the semiconductor device 10 including the STI structure 130-1 and the diffusion break structure 130-2 thereon, the semiconductor device 20 may not also include a diffusion break structure at least because no STI structure is formed for device isolation. Thus, an additional 3DSFET may be formed using the space for a diffusion break structure. However, even without forming an STI structure, a diffusion break structure may be formed to isolate two adjacent 3DSFETs, according to an embodiment.

In the above embodiments, the semiconductor device 20 includes only seven pairs of a lower source/drain region and an upper source/drain region, and three PN junction diodes. However, this is only an example, and more or less than these numbers of structural elements may be formed in the semiconductor device 20 with the backside isolation structure 220, at least one backside contact structure and at least one placeholder isolation structure in the D1 direction and the D2 direction, according to embodiments.

According to embodiments, a 3DSFET including the lower source/drain regions 232, 233 and the upper source/drain regions 282, 283 may form a logic device such as a complementary metal-oxide-semiconductor (CMOS) inverter, and a 3DSFET including the lower source/drain regions 234, 235 and the upper source/drain regions 284, 285 may form another logic device such as another CMOS device such as a NOR circuit. However, the two logic devices may be isolated from each other not through an STI structure but the backside isolation structure 220 and the placeholder isolation structure P3. According to an embodiment, the two 3DSFETs isolated from each other may be included in different nets in a semiconductor device. According to an embodiment, the two 3DSFETs isolated from each other may be included in different memory devices in a semiconductor device. According to an embodiment, the two 3DSFETs isolated from each other may be respectively included in a logic device and a memory device in a semiconductor device.

The above embodiments are described in reference to a plurality of 3DSFETs formed of nanosheet transistors and PN junction diodes. However, the disclosure may not be limited thereto. According to embodiments, one of more of the backside isolation structure 306 and the placeholder isolation structures P1-P5 may be formed at a back side of a semiconductor device including different types of active device such as FinFET or a combination of different types of transistors, and different types of passive device such as a PNP transistor.

Figure 3:
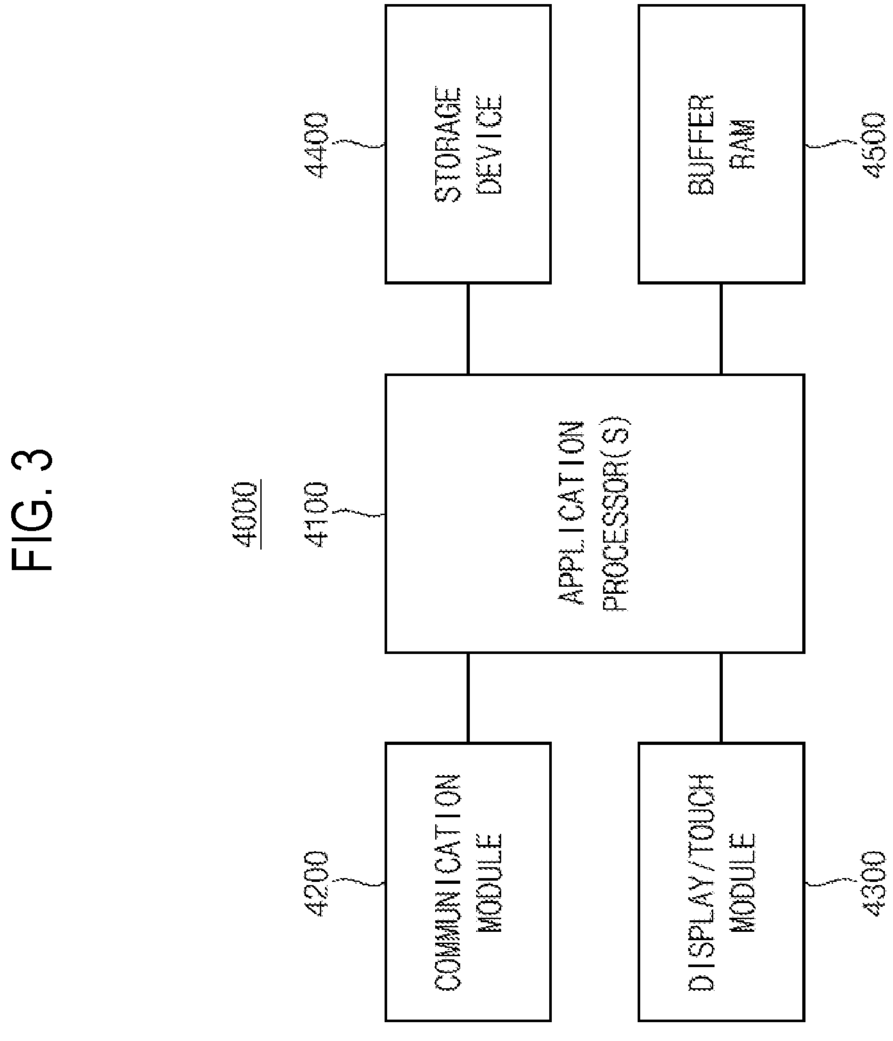
FIG. 3 is a schematic block diagram illustrating an electronic device including at least one of the semiconductor devices or a portion thereof as shown in FIGS. 1A-1C, 2A and 2B, according to an example embodiment.

FIG. 3 is a schematic block diagram illustrating an electronic device including at least one of the semiconductor devices 10 and 20, or a portion thereof, as shown in FIGS. 1A-1C, 2A and 2B, according to an example embodiment.

Referring to FIG. 3, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

The electronic device 4000 may further include at least one sensor such as an image sensor.

At least one component in the electronic device 4000 may include at least a portion of the semiconductor device 10 or the semiconductor device 20 shown in FIGS. 1A-1C, 2A and 2B.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor device comprising:

a $1^{st}$ source/drain region and a $1^{st}$ backside contact structure, vertically below the $1^{st}$ source/drain region, connected to the $1^{st}$ source/drain region;

a $2^{nd}$ source/drain region and a $1^{st}$ placeholder isolation structure vertically below the $2^{nd}$ source/drain region;

a backside isolation structure, on a back side of the semiconductor device, surrounding the $1^{st}$ backside contact structure and the $1^{st}$ placeholder isolation structure; and a $3^{rd}$ source/drain region and a $2^{nd}$ placeholder isolation structure vertically below the $3^{rd}$ source/drain region, wherein the $2^{nd}$ source/drain region is between the $1^{st}$ source/drain region and the $3^{rd}$ source/drain region, and wherein a horizontal distance between the $1^{st}$ backside contact structure and the $1^{st}$ placeholder isolation structure is equal to a horizontal distance between the $1^{st}$ placeholder isolation structure and the $2^{nd}$ placeholder isolation structure.

2. The semiconductor device of claim 1, wherein the $1^{st}$ placeholder isolation structure and the backside isolation structure have different material compositions.

3. The semiconductor device of claim 2, wherein the $1^{st}$ placeholder isolation structure comprises silicon nitride, and the backside isolation structure comprises silicon oxide.

4. The semiconductor device of claim 1, wherein an interface is formed between the backside isolation structure and the $1^{st}$ placeholder isolation structure.

5. The semiconductor device of claim 4, wherein the backside isolation structure and the $1^{st}$ placeholder isolation structure comprise the same material composition.

6. The semiconductor device of claim 1, wherein the $1^{st}$ placeholder isolation structure comprises a different material from the backside isolation structure, and wherein the $2^{nd}$ placeholder isolation structure comprises a different material from the backside isolation structure.

7. The semiconductor device of claim 6, wherein each of the $1^{st}$ and $2^{nd}$ placeholder isolation structures comprises silicon nitride, and the backside isolation structure comprises silicon oxide, and wherein a width of an uppermost portion of the $1^{st}$ placeholder isolation structure is less than or equal to a width of a lowermost portion of the $2^{nd}$ source/drain region.

8. The semiconductor device of claim 1, wherein at least one of the $1^{st}$ and $2^{nd}$ source/drain regions is a lower source/drain region of a stacked field-effect transistor comprising the lower source/drain region and an upper source/drain region stacked above the lower source/drain region.

9. The semiconductor device of claim 8, wherein the lower source/drain region and the upper source/drain region form different field-effect transistors.

10. A semiconductor device comprising:

a $1^{st}$ device comprising at least one $1^{st}$ transistor forming a logic device or a memory device;

a $2^{nd}$ device comprising at least one $2^{nd}$ transistor forming another logic device or another memory device; and a backside isolation structure at a back side of each of the $1^{st}$ and $2^{nd}$ devices, wherein the $1^{st}$ device is adjacent to the $2^{nd}$ device in a $1^{st}$ horizontal direction, wherein no shallow trench isolation (STI) structure is formed in the backside isolation structure adjacent the $1^{st}$ device in the $1^{st}$ horizontal direction, and wherein no STI structure is formed in the backside isolation structure adjacent the $1^{st}$ device in a $2^{nd}$ horizontal direction perpendicular to the $1^{st}$ horizontal direction.

11. The semiconductor device of claim 10, wherein the $1^{st}$ transistor comprises a $1^{st}$ pair of source/drain regions that are electrically connected via a $1^{st}$ channel structure, wherein the $2^{nd}$ transistor comprises a $2^{nd}$ pair of source/drain regions that are electrically connected via a $2^{nd}$ channel structure and are spaced apart from the $1^{st}$ pair of source/drain regions in the $1^{st}$ horizontal direction, and wherein a placeholder isolation structure is formed vertically below at least one of the $1^{st}$ pair of source/drain regions in the backside isolation structure.

12. The semiconductor device of claim 11, wherein the placeholder isolation structure and the backside isolation structure comprise different materials.

13. The semiconductor device of claim 12, wherein the placeholder isolation structure comprises silicon nitride, and the backside isolation structure comprises silicon oxide.

14. A semiconductor device comprising:

a $1^{st}$ device comprising at least one transistor;

a $2^{nd}$ device comprising at least one passive device;

a backside isolation structure at a back side of the $1^{st}$ and $2^{nd}$ devices; and a backside contact structure extending in the backside isolation structure and electrically connected to a source/drain region of the transistor, wherein the $1^{st}$ device is horizontally adjacent to the $2^{nd}$ device, wherein no shallow trench isolation (STI) structure is formed between the backside contact structure and the $2^{nd}$ device in the backside isolation structure, and wherein no STI structure is formed in contact with the backside contact structure in the backside isolation structure.

15. The semiconductor device of claim 14, wherein the source/drain region is a $1^{st}$ source/drain region of the transistor, wherein the semiconductor device further comprises a placeholder isolation structure vertically below a $2^{nd}$ source/drain region of the transistor in the backside isolation structure, and wherein no STI structure is formed in contact with the placeholder isolation structure in the backside isolation structure.

16. The semiconductor device of claim 15, wherein the placeholder isolation structure and the backside isolation structure comprise different materials.

17. The semiconductor device of claim 16, wherein the placeholder isolation structure comprises silicon nitride, and the backside isolation structure comprises silicon oxide.

18. The semiconductor device of claim 1, wherein the $1^{st}$ placeholder isolation structure and the $2^{nd}$ placeholder isolation structure are horizontally spaced apart, with the backside isolation structure therebetween and without any shallow trench isolation (STI) structure therebetween.

19. The semiconductor device of claim 10, wherein the $1^{st}$ device comprises a $1^{st}$ CMOS device, and wherein the $2^{nd}$ device comprises a $2^{nd}$ CMOS device different from the $1^{st}$ CMOS device.

20. The semiconductor device of claim 14, wherein the passive device comprises a $1^{st}$ region and a $2^{nd}$ region that are in the backside isolation structure, wherein the $1^{st}$ region has a first conductivity type, and the $2^{nd}$ region has a second conductivity type opposite the first conductivity type, and wherein no STI structure is formed between the backside contact structure and the $1^{st}$ and $2^{nd}$ regions in the backside isolation structure.

* * * * *